US009614033B2

(12) United States Patent
Kadow et al.

(10) Patent No.: US 9,614,033 B2
(45) Date of Patent: Apr. 4, 2017

(54) SEMICONDUCTOR DEVICE INCLUDING AN ISOLATION STRUCTURE AND METHOD OF MANUFACTURING A SEMICONDUCTOR DEVICE

(71) Applicant: Infineon Technologies AG, Neubiberg (DE)

(72) Inventors: Christoph Kadow, Gauting (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/977,393

(22) Filed: Dec. 21, 2015

(65) Prior Publication Data

US 2016/0190241 A1    Jun. 30, 2016

(30) Foreign Application Priority Data

Dec. 29, 2014    (DE) .................. 10 2014 119 698

(51) Int. Cl.
| | |
|---|---|
| *H01L 29/06* | (2006.01) |
| *H01L 21/78* | (2006.01) |
| *H01L 21/762* | (2006.01) |
| *H01L 29/78* | (2006.01) |
| *H01L 21/308* | (2006.01) |
| *H01L 29/10* | (2006.01) |

(Continued)

(52) U.S. Cl.
CPC ........ *H01L 29/0649* (2013.01); *H01L 21/308* (2013.01); *H01L 21/762* (2013.01); *H01L 21/76224* (2013.01); *H01L 21/78* (2013.01); *H01L 29/06* (2013.01); *H01L 29/0653* (2013.01); *H01L 29/1033* (2013.01); *H01L 29/4236* (2013.01); *H01L 29/42356* (2013.01); *H01L 29/45* (2013.01); *H01L 29/78* (2013.01)

(58) Field of Classification Search
CPC ............. H01L 29/0649; H01L 29/1033; H01L 29/42356; H01L 29/45; H01L 29/06; H01L 29/78; H01L 21/78; H01L 21/308; H01L 21/76224; H01L 21/762; H01L 29/4236; H01L 29/0653
USPC .................................. 257/329–331
See application file for complete search history.

(56) References Cited

U.S. PATENT DOCUMENTS

| | | | | |
|---|---|---|---|---|
| 2012/0098083 | A1* | 4/2012 | Meyer ............. | H01L 21/823878 257/500 |
| 2012/0126318 | A1* | 5/2012 | Kadow ................. | H01L 27/088 257/334 |
| 2012/0264259 | A1* | 10/2012 | Hirler ............. | H01L 21/823487 438/123 |

FOREIGN PATENT DOCUMENTS

| | | |
|---|---|---|
| DE | 102011054784 A1 | 4/2012 |
| DE | 102013107380 A1 | 1/2014 |

* cited by examiner

*Primary Examiner* — Thomas L Dickey
*Assistant Examiner* — Changhyun Yi
(74) *Attorney, Agent, or Firm* — Murphy, Bilak & Homiller, PLLC

(57) ABSTRACT

An embodiment of a semiconductor device comprises a first load terminal contact area at a first side of a semiconductor body. A second load terminal contact area is at a second side of the semiconductor body opposite to the first side. A control terminal contact area is at the second side of the semiconductor body. An isolation structure extends through the semiconductor body between the first and second sides. The isolation structure electrically isolates a first part of the semiconductor body from a second part of the semiconductor body. A first thickness of the first part of the semicon- (Continued)

ductor body is smaller than a second thickness of the second part of the semiconductor body.

16 Claims, 5 Drawing Sheets

(51) Int. Cl.
*H01L 29/423* (2006.01)
*H01L 29/45* (2006.01)

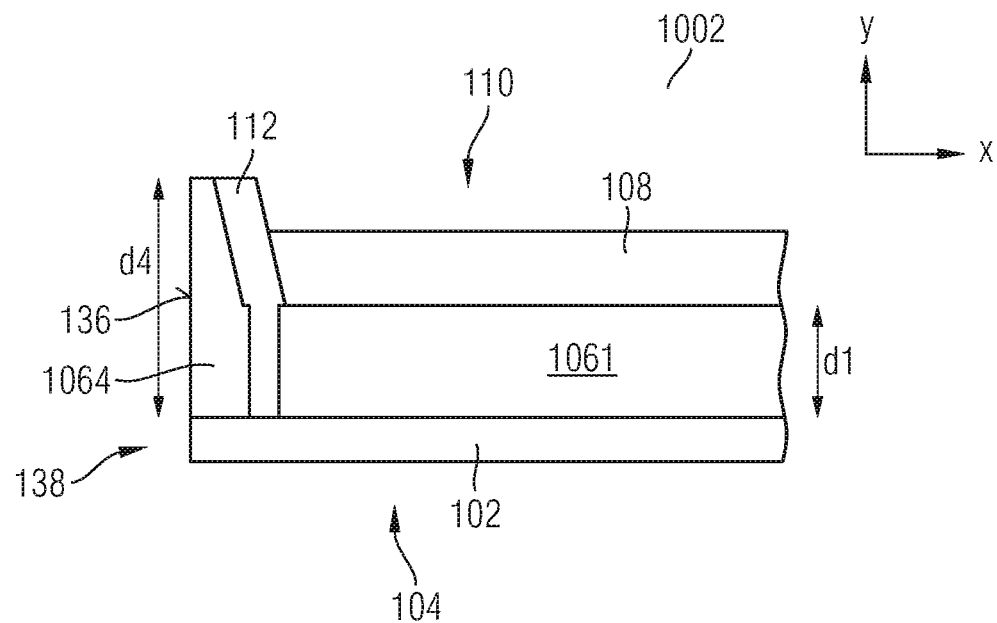
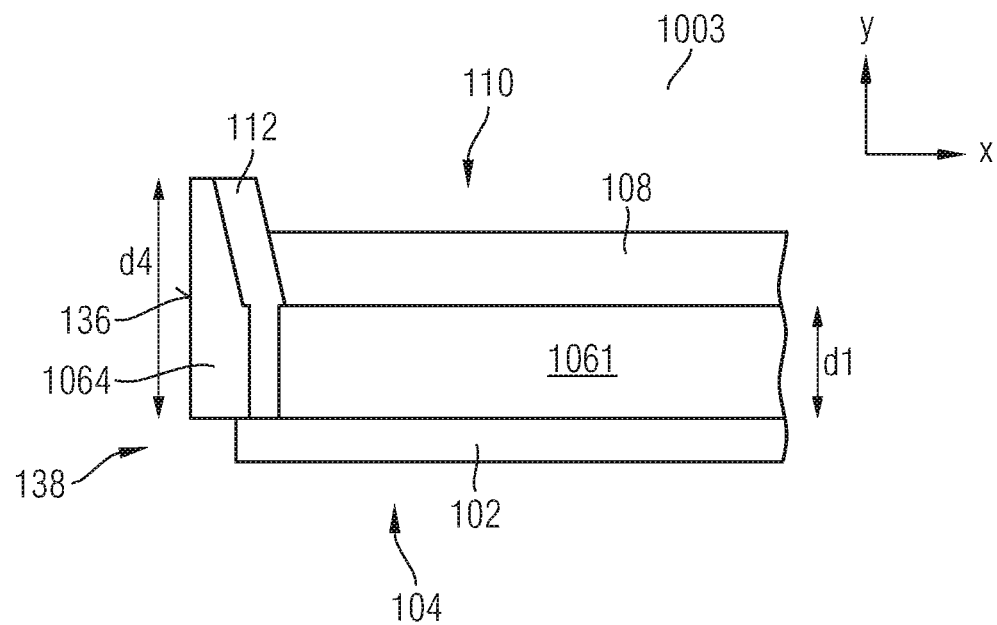

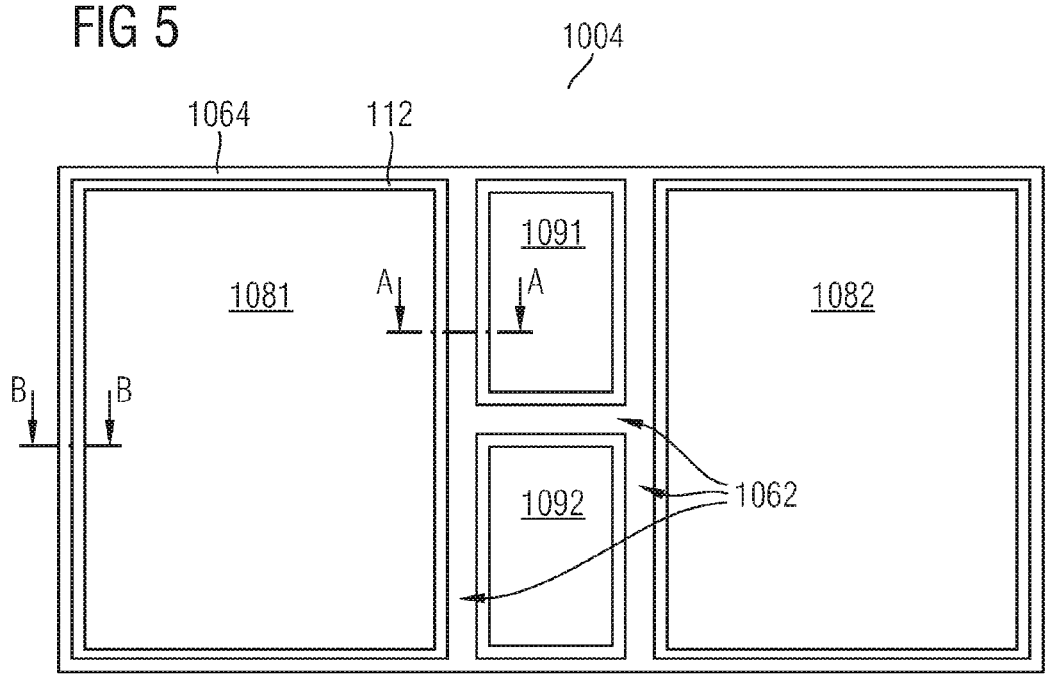
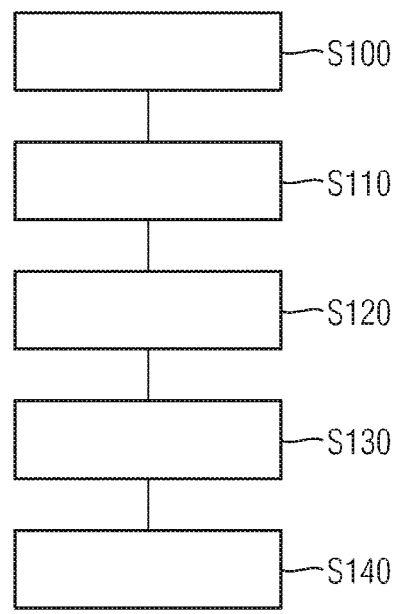

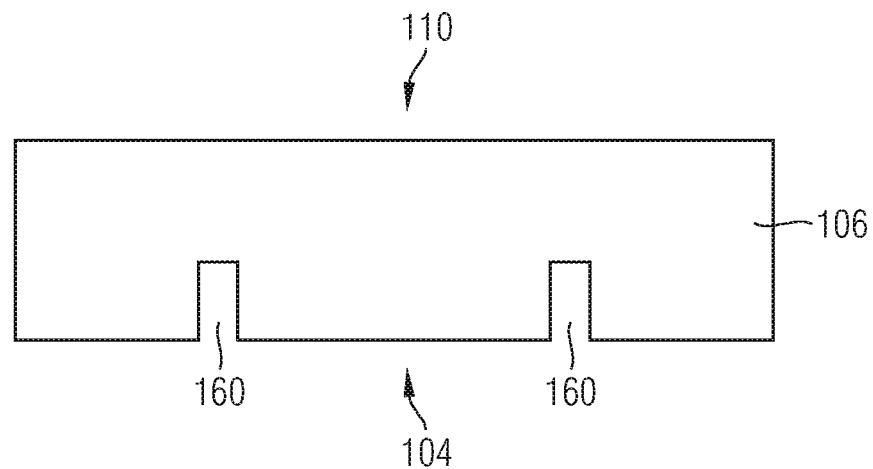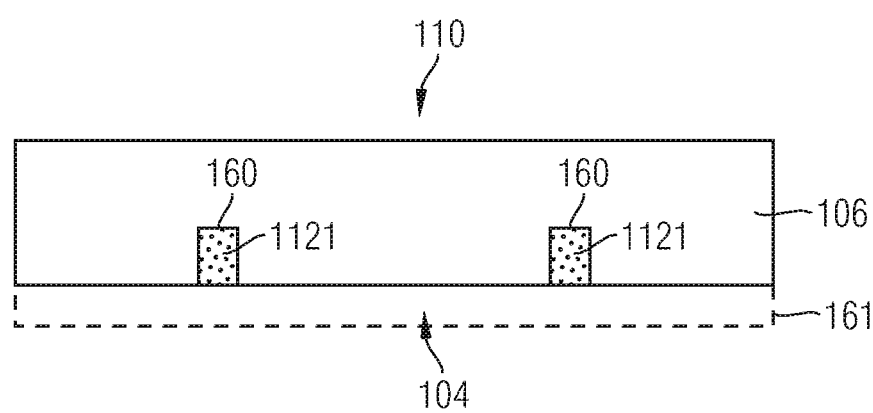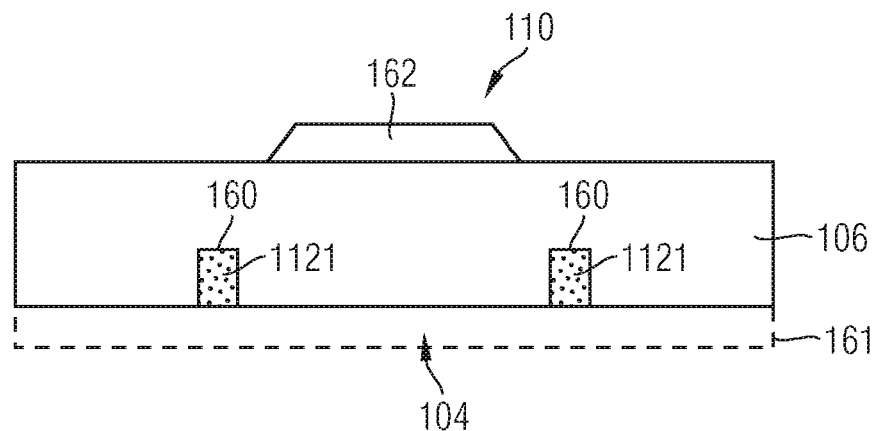

SEMICONDUCTOR DEVICE INCLUDING AN ISOLATION STRUCTURE AND METHOD OF MANUFACTURING A SEMICONDUCTOR DEVICE

PRIORITY CLAIM

This application claims priority to German Patent Application No. 10 2014 119 698.8 filed on 29 Dec. 2014, the content of said application incorporated herein by reference in its entirety.

BACKGROUND

Improving semiconductor devices such as low-side switches or high side switches is challenging. A common source configuration allows for multi-n-channel low-side switches or multi-p-channel high-side switches monolithically integrated in a semiconductor body. Electrical isolation of different parts of the semiconductor body, sufficient thermal coupling between source and a heat sink, and reduction of parasitic inductances are key challenges in this regard.

It is an object to provide an improved semiconductor device and a manufacturing method therefor.

SUMMARY

According to an embodiment of a semiconductor device, the semiconductor device includes a first load terminal contact area at a first side of a semiconductor body. The semiconductor device further includes a second load terminal contact area at a second side of the semiconductor body opposite to the first side, and a control terminal contact at the second side of the semiconductor body. An isolation structure extending through the semiconductor body is between the first and second sides. The isolation structure electrically isolates a first part of the semiconductor body from a second part of the semiconductor body. A first thickness d1 of the first part of the semiconductor body is smaller than a second thickness d2 of the second part of the semiconductor body.

According to a method of manufacturing a semiconductor device, the method includes forming a trench into a semiconductor body from a first side, and forming a first isolation part in the trench. The method further includes forming a mask pattern at a second side of the semiconductor body opposite to the first side, and partly removing the semiconductor body in an unmasked part of the semiconductor body from the second side, thereby forming a side face of the semiconductor body between a non-recessed part of the semiconductor body and a recessed part of the semiconductor body. The method further includes forming a second isolation part on the side face of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIGS. 3 to 4 are schematic cross-sectional views illustrating semiconductor devices with different arrangement of a load terminal contact area at a first side of a semiconductor body, according to embodiments.

FIG. 5 is a top view of an embodiment of a multi-channel insulated gate field effect transistor.

FIG. 6 is a chart for illustrating a method of manufacturing a semiconductor device according to an embodiment.

FIGS. 7A to 7E are cross-sectional views of a semiconductor body for illustrating processes of manufacturing a semiconductor device.

DETAILED DESCRIPTION

Figure 1:
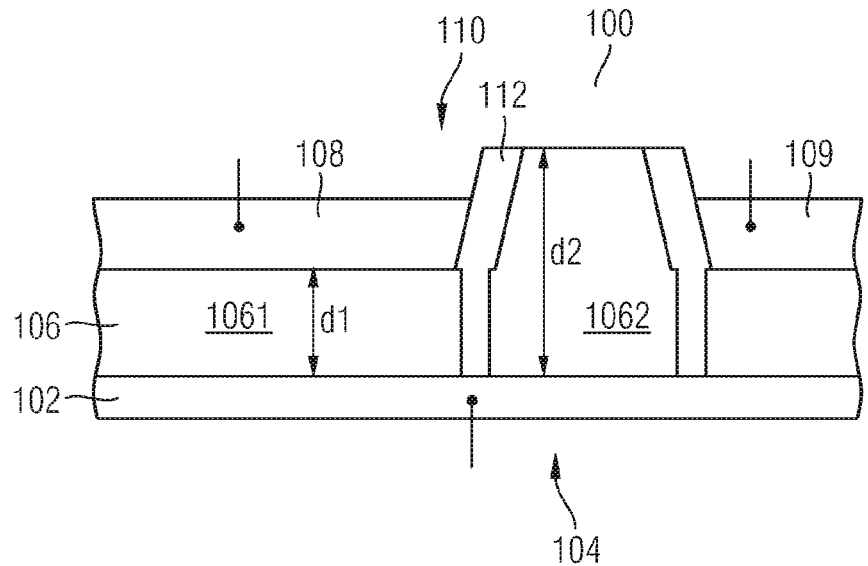
FIGS. 1 and 2 are schematic cross-sectional views illustrating semiconductor devices, according to embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude the presence of additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer," "substrate," "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e., parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

The semiconductor device may have terminal contacts such as contact pads (or electrodes) which allow electrical contact to be made with the integrated circuits or secrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), PVD (physical vapor deposition), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. In particular, stealth dicing, which is a specific technique using laser dicing may be applied. Stealth dicing allows suppressing cutting waste and is therefore a suitable process for cutting work pieces that are vulnerable to contamination. Further, it is a dry process that does not require cleaning, and is therefore also suitable for processing sensitive structures such as, e.g., MEMS, that are vulnerable to load. Further benefits which may be achieved by the stealth dicing technology are high-speed dicing, superior breakage strength, small kerf and low running costs.

In stealth dicing technology, a laser beam of a wavelength capable of transmitting through the semiconductor wafer is focused onto a point inside the semiconductor wafer. Due to a non-linear absorption effect, only localized points inside the semiconductor wafer may be selectively laser-machined, whereby damaging of the front and back surface of the semiconductor wafer may be avoided. The semiconductor wafer can be diced by moving the relative positions of the laser beam and the semiconductor wafer in order to scan the semiconductor wafer according to the desired dicing pattern.

The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

An embodiment of a semiconductor device is illustrated in the schematic cross-sectional view of FIG. 1.

The semiconductor device 100 includes a first load terminal contact area 102 at a first side 104 of a semiconductor body 106. A second load terminal contact area 108 is at a second side 110 of the semiconductor body 106. A control terminal contact area 109 is at the second side 110 of the semiconductor body 106. An isolation structure 112 extends through the semiconductor body 106 between the first and second sides 104, 110. The isolation structure 112 electrically isolates a first part 1061 of the semiconductor body 106 from a second part 1062 of the semiconductor body 106. A first thickness d1 of the first part 1061 of the semiconductor body 106 is smaller than a second thickness d2 of the second part 1062 of the semiconductor body 106.

The semiconductor body 106 may include a semiconductor substrate and none, one, two, three, or even more optional semiconductor layer(s), for example epitaxial semiconductor layer(s) thereon. The thickness d2 of the second part 1062 of the semiconductor body 106 may range between tens of micrometers to several hundreds of micrometers.

The thickness d1 of the first part 1061 of the semiconductor body 106 may be in a range of 5 µm to 50 µm, for example be smaller than 30 µm, 20 µm or 15 µm.

According to an embodiment, one or more semiconductor layers of the semiconductor body 106 are arranged at the second side 110 between a semiconductor substrate of the semiconductor body 106 and the first load terminal contact area 102.

The isolation structure 112 may include one or more isolating layer(s), for example one or more isolating oxide(s), for example silicon oxide, nitride(s), for example silicon nitride, high-k dielectric(s), and low-k dielectric(s).

According to an embodiment, the semiconductor device 100 is an insulated gate field effect transistor (IGFET). The first load terminal contact area 102 may be a source contact area, the second load terminal contact area 108 may be a drain contact area and the control terminal contact area 109 may be a gate contact area, for example.

In the embodiment illustrated in FIG. 1 functional semiconductor regions, for example p-doped and/or n-doped semiconductor wells and/or p-doped or n-doped buried semiconductor layers as well as planar or trench gate structures including gate dielectric(s) and gate electrode(s) as well as optional field dielectric(s) and field electrode(s) may be formed in the semiconductor body 106 at the first side 104, for example by appropriate front-end-of-line (FEOL) processes from the first side 104.

According to an embodiment, the semiconductor device 100 is a multi-channel insulated gate field effect transistor. The multi-channel insulated gate field effect transistor may be a multi p-channel high side switch including a common source terminal contact area, electrically separated multiple drain terminal contact areas and electrically separated multiple gate terminal contact areas. The multi-channel insulated gate field effect transistor may also be a multi n-channel low side switch including a common source terminal contact area, electrically separated multiple drain terminal contact areas and electrically separated multiple gate terminal contact areas.

The semiconductor device 100 illustrated in FIG. 1 enables several technical benefits. The isolation structure 112 enables electric isolation of different semiconductor parts such as different channels of a multi-channel IGFET in common-source technology. Whereas the first part 1061 of the semiconductor body 106 may be optimized with respect to functional elements therein, for example electrically isolated transistors having a drift zone thickness of less than d1, the second part 1062 of the semiconductor body 106 having a greater thickness d2 than the first part provides mechanical strength and constitutes a suitable semiconductor part for chip dicing, for example. Furthermore, the semiconductor device 100 can be manufactured without suffering from constraints caused by rear side processing in conjunction with thin wafer techniques.

Figure 2:
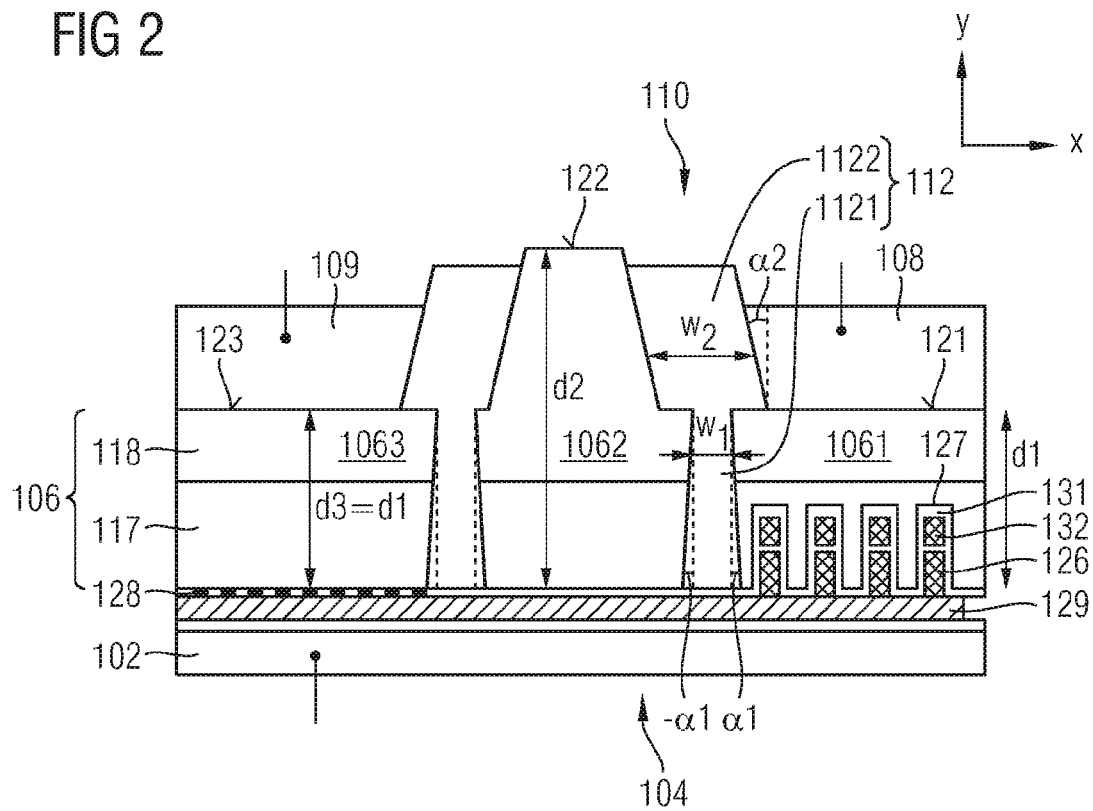

Another embodiment of a semiconductor device 1001 is illustrated in the schematic cross-sectional view of FIG. 2.

The semiconductor body 106 includes a semiconductor substrate 118 and a semiconductor layer 117, for example an epitaxial semiconductor layer, thereon.

The second load terminal contact area 108 is in the first part 1061 of the semiconductor body 106 adjoining a first surface part 121 of the semiconductor body 106 at the second side 110. The control terminal contact area 109 is in a third part 1063 of the semiconductor body 106 adjoining a third surface part 123 of the semiconductor body 106 at the second side 110. The third part 1063 of the semiconductor body 106 has a third thickness d3 that is smaller than the second thickness d2 of the second part 1062 of the semiconductor body 106. The third thickness d3 is equal to the first thickness d1.

The isolation structure 112 extending through the semiconductor body 106 includes a first isolation part 1121 extending from a surface of the semiconductor body 106 at the first side 104 to a level of the first surface part 121. The isolation structure 112 further includes a second isolation part 1122 extending from the level of the first surface part 121 to a second surface part 122 of the second part 1062 of the semiconductor body 106 at the second side 110.

According to the embodiment illustrated in FIG. 2 a first width w1, for example average width of the first isolation part 1121 is smaller than a second width w2, for example average width of the second isolation part 1122. According to another embodiment, the first width w1 is equal to the second width w2. According to yet another embodiment, the first width w1 is greater than the second width w2.

Isolating materials of the first and second isolation parts 1121, 1122 may be equal or may at least partly be different from each other.

According to the embodiment illustrated in FIG. 2 a first angle of inclination α1 between a vertical direction y between the first and second sides 104, 110 and the first isolation part 1121 is smaller than a second angle of inclination α2 between the vertical direction y and the second isolation part 1122. The second isolation part 1122 may be formed by a spacer etch process, for example.

According to the embodiment illustrated in FIG. 2, opposite second isolation parts 1122, i.e., the second isolation parts 1122 including the second part 1062 of the semiconductor body 106 sandwiched between, lead to a taper towards the second side 110. Such a shape of the second part 1062 of the semiconductor body 106 may be caused, for example, by an etch process where the second surface part 122 is covered with an etch mask for etching the semiconductor body 106 in an unmasked area surrounding the second surface part 122, for example.

According to another embodiment, the first angle of inclination α1 is equal to the second angle of inclination α2.

According to yet another embodiment, the first angle of inclination α1 is greater than the second angle of inclination α2. According to an embodiment, opposing walls of the first isolation part 1121 have an opposite inclination with respect to the vertical direction y, i.e., α1 and −α1. This may be caused by a tapered first isolation part 1121 due to processing, for example.

The semiconductor device 1001 further includes a control electrode 126, for example a gate electrode at the first side 104 in a trench 127. The control electrode 126 is electrically connected to the control terminal contact area 109 at the second side 110 through the third part 1063 of the semiconductor body 106. Interlayer contacts 128, for example contact plugs or contact lines, and a conductive wiring layer part 129, for example a wiring line, electrically connect the control electrode 126 in the first part 1061 of the semiconductor body 106 and the third part 1063 of the of the semiconductor body 106.

The semiconductor device 1001 further includes a field electrode 132 in the trench 127 between the control electrode 126 and the second side 110. According to other embodiments, the semiconductor device 1001 may include none or even more than one field electrode. By way of example, a number of field electrodes may depend upon a blocking voltage requirement of the semiconductor device 1001. The control and optional field electrode(s) may be formed of conductive material(s), for example highly doped semiconductor material such as highly doped polycrystalline silicon and/or metal(s), for example.

The control electrode 126 of the embodiment illustrated in FIG. 2 is a gate electrode in the trench 127 surrounded by a dielectric structure 131. According to another embodiment, the control electrode 126 is a planar gate electrode between the first load terminal contact area 102 and the semiconductor body 106.

As is illustrated in the schematic cross-sectional view of a semiconductor device 1002 of FIG. 3, a fourth thickness d4 of a semiconductor body portion 1064 including a lateral face 136 at an edge 138 of the semiconductor body 106 is greater than the first thickness d1. The lateral face 136 at the edge 138 may be formed by a chip dicing process, for example. The fourth thickness d4 may be equal to the second thickness d2 illustrated in FIGS. 1 and 2, for example for securing mechanical stability of the semiconductor body 106 during processing and dicing.

In the embodiment illustrated in FIG. 3, the first load terminal contact area 102 covers the semiconductor body portion 1064 at the first side 104. Optional dielectric and wiring layers, for example as illustrated in FIG. 2, may be arranged in between the first load terminal contact area 102 and the semiconductor body portion 1064.

In another embodiment of a semiconductor device 1003 illustrated in the FIG. 4, the first load terminal contact area 102 is at least partly absent in the semiconductor body portion 1064. The first load terminal contact area 102 illustrated in FIG. 4 may be the result of a lithographic patterning process of a conductive layer or layer structure at the first side 104, for example.

The schematic top view of FIG. 5 is an illustration of an embodiment of a multi-channel insulated gate field effect transistor (IGFET) 1004 integrated in the semiconductor body 106.

The IGFET 1004 is a two-channel IGFET including second load terminal contact areas 1081, 1082, for example drain terminal contact areas, at the second side 110. The second load terminal contact area 1081 is part of a first channel of the IGFET 1004. The second load terminal contact area 1082 is part of a second channel of the IGFET 1004.

The IGFET 1004 further includes control terminal contact areas 1091, 1092, for example gate terminal contact areas, at the second side 110. The control terminal contact area 1091 is part of the first channel of the IGFET 1004. The control terminal contact area 1092 is part of the second channel of the IGFET 1004.

The second part 1062 of the semiconductor body 106 is arranged between neighboring contact areas, i.e., between the second load terminal contact area 1081 and each one of the control terminal contact areas 1091, 1092, between the second load terminal contact area 1082 and each one of the control terminal contact areas 1091, 1092, and between the control terminal contact areas 1091, 1092. Examples of a cross sectional views along the line A-A are illustrated in FIGS. 1 and 2, respectively. Examples of a cross sectional views along the line B-B are illustrated in FIGS. 3 and 4, respectively. The second part 1062 merges into the semiconductor body portion 1064 surrounding the second load and control terminal areas 1081, 1082, 1091, 1092.

According to one embodiment, the IGFET 1004 is a multi p-channel high side switch. According to another embodiment, the IGFET 1004 is a multi n-channel low side switch.

A method of manufacturing a semiconductor device is schematically illustrated in the process chart of FIG. 6.

Process feature S100 includes forming a trench into a semiconductor body from a first side.

Process feature S110 includes forming a first isolation part in the trench.

Process feature S120 includes forming a mask pattern at a second side of the semiconductor body opposite to the first side.

Process feature S130 includes partly removing the semiconductor body in an unmasked part of the semiconductor body from the second side, thereby forming a side face of the semiconductor body between a non-recessed part of the semiconductor body and a recessed part of the semiconductor body.

Process feature S140 includes forming a second isolation part on the side face of the semiconductor body.

According to an embodiment, the semiconductor body is removed up to the first isolation part. The first isolation part may act as an etch stop, for example.

The method may further comprise forming a first load terminal contact area at the first side of the semiconductor body, forming a second load terminal contact area at the second side of the semiconductor body, and forming a control terminal contact at the second side of the semiconductor body.

The method may further comprise front-end-processing before partly removing the semiconductor body.

According to an embodiment, the method further comprises dicing the semiconductor body in the non-recessed part of the semiconductor body.

According to an embodiment, the second isolation part is formed by a spacer process.

FIGS. 7A-7E schematically illustrate a method of manufacturing a semiconductor device in accordance with one embodiment.

FIG. 7A schematically illustrates forming a trench 160 into the semiconductor body 106, for example a semiconductor wafer from the first side 104. The semiconductor body 106 may be disc-shaped and the diameter of the semiconductor body 106 may, for example be equal to or greater than 200 or 300 mm.

A process called dicing before grinding (DBG) may have been applied to the semiconductor body 106 in previous processes (not illustrated in FIGS. 7A-7E). In the DBG process grooves are machined into a surface of the semiconductor body 106 at the first side 104. The grooves may have a depth which is smaller than the thickness of the semiconductor body 106, for example 10 to 70 µm. The grooves may, e.g., run on the surface of the semiconductor body 106 at the first side 104 in a region where the semiconductor body 106 has not been processed. The grooves may run along the dicing lines or dicing streets where the semiconductor body 106 will be cut to be singulated into at least one semiconductor chip.

Figure 7D:
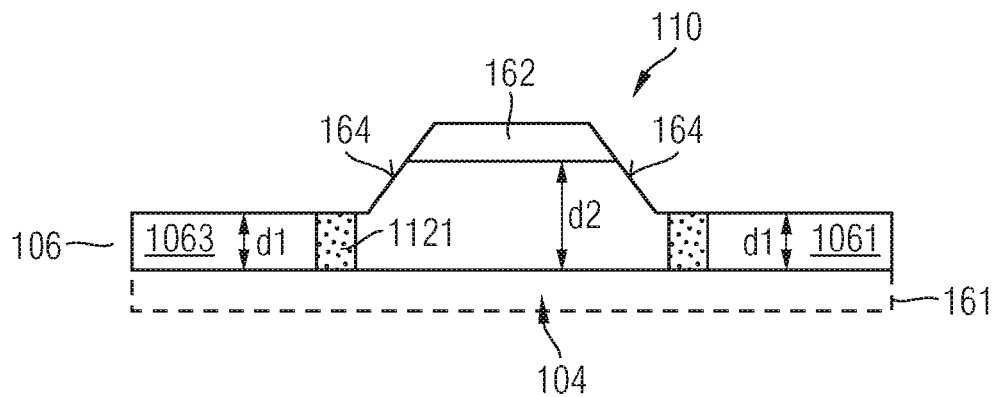

The semiconductor body 106 as shown in FIG. 7A may have been thinned in a previous process (not shown in FIGS. 7A-7E). The step of thinning the semiconductor body 106 may, e.g., be performed after the DBG step. The thinned surface may, e.g., be at the second side 110 of the semiconductor body 106.

The trench 160 may be formed into the semiconductor body 106 by an etch process, for example an anisotropic etch process using an etch mask. Further FEOL processes may be carried out before and after trench formation to form active structures such as, e.g., integrated circuits or devices including semiconductor wells or buried semiconductor layers, electrodes, dielectrics and wiring levels. Examples of FEOL processes include formation of highly doped source regions, body regions, planar and/or trench gate electrodes, dielectrics and wiring levels in case of IGFET formation, for example as illustrated in FIGS. 1 and 2 at the first side 104. Dielectrics, wiring levels such as patterned or unpatterned metallization layers may be arranged in an area 161 at the first side 104, for example. Processing the first side 104 may be carried out before or after optional thinning the second side 110 of the semiconductor body 106. The thinned surface may, e.g., be at the first side 104 of the semiconductor body 106. In this case the first side of the semiconductor body 106 is thinned first, then the front side is processed to form active structures and, optionally, the grooves are machined into the surface of the semiconductor body 106 at the first side 104. Thinning the semiconductor body 106 may comprise at least one of mechanical thinning, in particular grinding, chemical mechanical polishing (CMP), and wet etching. Thinning the semiconductor body 106 may also comprise all of the aforementioned processes. Thinning may, e.g., comprise mechanical thinning and a subsequent damage etching process. The entire main surface of the semiconductor wafer may be subjected to thinning.

After the two (optional) processes of DBG grinding and thinning, the semiconductor body 106 may have the thickness d2 ranging between tens of micrometers to hundreds of micrometers, for example between 50 μm and 700 μm or between 100 μm and 700 μm, or between 100 μm and 500 μm.

The schematic cross sectional view of FIG. 7B illustrates a process of forming the first isolation part 1121 in the trench 160. The first isolation part 1121 may be formed by carrying out or more dielectric layer formation techniques, for example chemical vapor deposition (CVD) or thermal growth of dielectrics such as oxides, for example.

Referring to the schematic cross sectional view of FIG. 7C, a mask structure 162, for example a polymer structure or a hard mask structure is formed on the surface of the semiconductor body 106 at the second side 110. In FIG. 7C, the mask structure 162 may be formed by applying a polymer on the surface of the semiconductor body 106 at the second side 110 by techniques such as spin coating, prebaking the resist-coated semiconductor body, lithographic patterning of the photoresist, and hard baking (curing) the photoresist. The mask structure 162 may, e.g., comprise an imide, in particular a photoimide, a photoresist, a thermosetting material or a thermoplastic material. According to other embodiments, the mask structure 162 may be formed by lithographic patterning of a hard mask, for example a dielectric mask such as an oxide mask.

The mask structure 162 may, e.g., be formed using at least one of lithography, in particular photolithography, printing, and dispensing. The mask structure 162 may include a plurality of mask parts similar to the mask part illustrated in FIG. 7C.

Mask parts of the mask structure 162 may be formed in between neighboring trenches 160 as is illustrated in FIG. 7C. The mask parts of the mask structure 162 may correspond to and overlay the dicing streets and isolation parts between different terminals of IGFET channels, for example.

The schematic cross sectional view of FIG. 7D illustrates a process of partly removing the semiconductor body 106 in an unmasked part of the semiconductor body 106 from the second side 110, thereby forming a side face 164 of the semiconductor body 106 between a non-recessed part of the semiconductor body 106 and a recessed part of the semiconductor body 106. By doing so, the semiconductor body 106 is selectively thinned in regions outside the mask structure 162 at the second side 110 while the region of the semiconductor body 106 where the mask structure 162 is arranged remains unchanged. By removing semiconductor body material at exposed parts of the second side 110, a surface of the semiconductor body 106 at the second side 110 gets structured in view of its level, i.e., is not flat. There may be first regions and second regions, wherein the level of the first regions and the level of the second regions are different. In the case of the embodiment of FIG. 7D, removing the semiconductor body material at the exposed portions at the second side 110 leads to the first and third parts 1061, 1063 having the thickness d1 smaller than the second thickness d2 of the second part 1062 covered by mask structure 162. The second part 1062 provides mechanical strength and rigidity to the semiconductor body 106 and finally also to diced chips. This allows to manufacture a semiconductor device, for example as illustrated in FIGS. 1 to 5 having a small thickness d2 in regions, for example the first and third parts 1061, 1063 where active structures may be located. The first isolation part 1121 may act as a stop layer when removing the semiconductor body material at the exposed portions at the second side 110, for example.

Removing semiconductor material at the exposed second side 104 of the semiconductor body 106 may be carried out by etching, for example particular dry etching or wet etching. One example for dry etching is plasma etching.

Figure 7E:
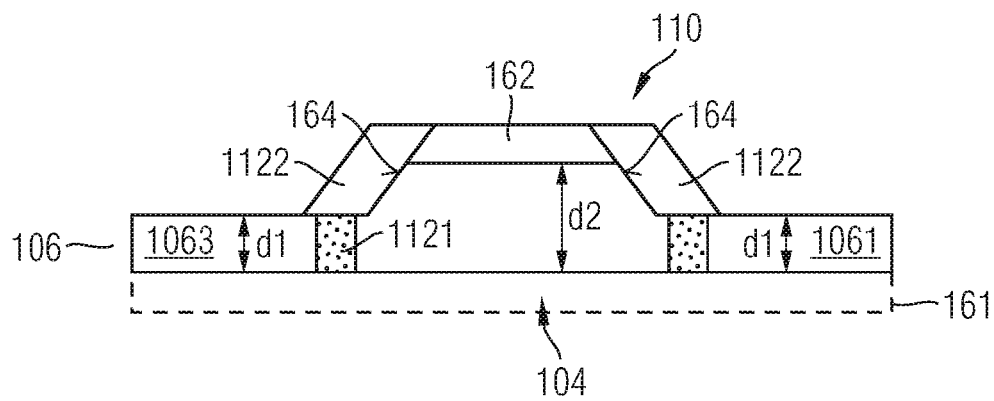

The schematic cross sectional view of FIG. 7E illustrates a process of forming the second isolation part 1122 on the side face 164 of the semiconductor body 106. The second isolation part 1122 may be formed by carrying out or more dielectric layer formation techniques, for example chemical vapor deposition (CVD) or thermal growth of dielectrics such as oxides, for example. The first and second isolation parts 1121, 1122, although manufactured in different processes, may include same isolating materials, for example oxides. The first and second isolation parts may also at least partly differ with regard to isolation materials.

According to an embodiment, the second isolation part 1122 is formed by a spacer process, for example by dielectric layer(s) formation on the semiconductor body 106 at the second side 110 followed by a spacer etch process leaving the second isolation part 1122 as a remainder of the spacer etch process while removing the dielectric layer(s) in other parts, for example flat surface parts on the semiconductor body 106 at the second side 110.

The mask structure 162 may be removed before or after formation of the second isolation part 1122.

Further processes at the second side 110 will follow, for example formation of contact areas as illustrated in FIGS. 1 to 5 or chip bonding processes. The methods illustrated in FIGS. 6 and 7A to 7E allow, inter alia, for manufacturing of semiconductor devices as illustrated in FIGS. 1 to 5, for example.

The first side 104 of the semiconductor body 106 may, e.g., be attached on a carrier by gluing, soldering, or sintering. In case the semiconductor device 100 is attached by soldering, a soft solder or a diffusion solder may be used to attach the semiconductor device 100. The semiconductor body 106 may, e.g., be attached with the second side 110 on the carrier. The carrier may, e.g., be one of a lead frame, a ceramics substrate such as, e.g., a DCB (direct copper bonded) ceramics substrate, and a printed circuit board (PCB).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first load terminal contact area at a first side of a semiconductor body;
a second load terminal contact area at a second side of the semiconductor body opposite to the first side;
a control terminal contact area at the second side of the semiconductor body;
an isolation structure extending through the semiconductor body between the first and second sides, the isolation structure electrically isolating a first part of the semiconductor body from a second part of the semiconductor body, and wherein
a first thickness of the first part of the semiconductor body is smaller than a second thickness of the second part of the semiconductor body,
wherein the first side of the semiconductor body and the second side of the semiconductor body each extend along a sing plane,
wherein the first thickness of the first part of the semiconductor body is measured between the first side of the semiconductor body and the second side of the semiconductor body, and
wherein the second thickness of the second part of the semiconductor body is measured between the first side of the semiconductor body and a third side of the semiconductor body that is vertically offset from the second side of the semiconductor body.

2. The semiconductor device of claim 1, further comprising a control electrode at the first side, wherein the control electrode is electrically connected to the control terminal contact area at the second side through the semiconductor body.

3. The semiconductor device of claim 2, wherein the second load terminal contact area is in the first part of the semiconductor body adjoining a first surface part of the semiconductor body at the second side, the control terminal contact area is in a third part of the semiconductor body adjoining a third surface part of the semiconductor body at the second side, the third part of the semiconductor body has a smaller thickness than the second part of the semiconductor body.

4. The semiconductor device of claim 3, wherein the isolation structure extending through the semiconductor body includes a first isolation part extending from a surface of the semiconductor body at the first side to the first surface part, and a second isolation part extending from the first surface part to a second surface part of the second part of the semiconductor body at the second side.

5. The semiconductor device of claim 4, wherein a first width of the first isolation part is smaller than a second width of the second isolation part.

6. The semiconductor device of claim 4, wherein a first angle of inclination between a vertical direction and one of the first and second sides and the first isolation part is smaller than a second angle of inclination between the vertical direction and a side of the second isolation part.

7. The semiconductor device of claim 1, wherein a fourth thickness of a portion of the semiconductor body including a lateral face at an edge of the semiconductor body is greater than the first thickness.

8. The semiconductor device of claim 7, wherein the control terminal contact area is in a third part of the semiconductor body adjoining a third surface part of the semiconductor body at the second side, and wherein the first thickness equals a
third thickness of the semiconductor body in the third part.

9. The semiconductor device of claim 7, wherein first load terminal contact area at the first side is at least partly absent in the semiconductor body portion at the edge of the semiconductor body.

10. The semiconductor device of claim 1, further comprising a control electrode at the first side, wherein the semiconductor device is an insulated gate field effect transistor and the control electrode is one of a planar gate electrode on the semiconductor body and a gate electrode in a trench extending into the semiconductor body from the first side.

11. The semiconductor device of claim 1, wherein the semiconductor device is a multi-channel insulated gate field effect transistor integrated in the semiconductor body.

12. The semiconductor device of claim 11, wherein the multi-channel insulated gate field effect transistor is a multi p-channel high side switch.

13. The semiconductor device of claim 11, wherein the multi-channel insulated gate field effect transistor is a multi n-channel low side switch.

14. The semiconductor device of claim 1, wherein the second part of the semiconductor body extends through the second load terminal contact area and the control terminal contact area.

15. The semiconductor device of claim 14, wherein the third side of the semiconductor body is exposed.

16. A semiconductor device, comprising:
a first load terminal contact area at a first side of a semiconductor body;
a second load terminal contact area at a second side of the semiconductor body opposite to the first side;
a control terminal contact area at the second side of the semiconductor body;
a control electrode at the first side, wherein the control electrode is electrically connected
to the control terminal contact area at the second side through the semiconductor body;
an isolation structure extending through the semiconductor body between the first and second sides, the isolation structure electrical isolating a first part of the semiconductor body, from a second part of the semiconductor body,
wherein a first thickness of the first part of the semiconductor body is smaller than a second thickness of the second part of the semiconductor body,
wherein the second load terminal contact area is in the first part of the semiconductor body adjoining a first surface part of the semiconductor body at the second side, the control terminal contact area is in a third part of the semiconductor body adjoining a third surface part of the semiconductor body at the second side, the third part of the semi conductor body has a smaller thickness than the second part of the semiconductor body,
wherein the isolation structure extending through the semiconductor body includes a first isolation part extending from a surface of the semiconductor body at the first side to the first surface part, and a second isolation part extending from the first surface part to a second surface part of the second part of the semiconductor body at the second side, and wherein a first angle of inclination between a vertical direction and one of the first and second sides and the first isolation part is smaller than a second angle of inclination between the vertical direction and a side of the second isolation part.

\* \* \* \* \*

UNITED STATES PATENT AND TRADEMARK OFFICE
CERTIFICATE OF CORRECTION

PATENT NO. : 9,614,033 B2  
APPLICATION NO. : 14/977393  
DATED : April 4, 2017  
INVENTOR(S) : Kadow et al.

Page 1 of 1

It is certified that error appears in the above-identified patent and that said Letters Patent is hereby corrected as shown below:

In the Claims

Column 11, Line 24 (Claim 1), please change "sing" to -- single --.

Column 12, Line 47 (Claim 16), please change "electrical" to -- electrically --.

Column 12, Line 48 (Claim 16), please change "body," to -- body --.

Column 12, Line 59 (Claim 16), please change "semi conductor" to -- semiconductor --.

Signed and Sealed this  
Eighteenth Day of July, 2017

Joseph Matal  
*Performing the Functions and Duties of the*  
*Under Secretary of Commerce for Intellectual Property and*  
*Director of the United States Patent and Trademark Office*